United States Patent [19]

Blonder

[11] Patent Number: 4,904,036
[45] Date of Patent: Feb. 27, 1990

[54] SUBASSEMBLIES FOR OPTOELECTRONIC HYBRID INTEGRATED CIRCUITS

[75] Inventor: Greg E. Blonder, Summit, N.J.

[73] Assignee: American Telephone and Telegraph Company, AT&T Bell Laboratories, Murray Hill, N.J.

[21] Appl. No.: 163,688

[22] Filed: Mar. 3, 1988

[51] Int. Cl.$^4$ ............................................. G02B 6/12
[52] U.S. Cl. ............................... 350/96.11; 350/96.17; 357/74
[58] Field of Search ........................ 350/96.11, 96.17; 357/74, 19, 30 M

[56] References Cited

U.S. PATENT DOCUMENTS

| | | | |
|---|---|---|---|
| 3,894,789 | 7/1975 | Kobayashi et al. | 350/96 |
| 4,030,811 | 6/1977 | Khoe et al. | 350/96 |
| 4,079,404 | 3/1978 | Comerford et al. | 357/19 |
| 4,114,177 | 9/1978 | King | 357/19 |
| 4,130,343 | 12/1978 | Miller et al. | 350/96.15 |
| 4,136,928 | 1/1979 | Logan et al. | 357/19 X |
| 4,186,994 | 2/1980 | Denkin et al. | 350/96.17 |
| 4,210,923 | 7/1980 | North et al. | 357/30 |
| 4,411,057 | 10/1983 | Duda et al. | 29/569 L |
| 4,425,146 | 1/1984 | Izawa et al. | 65/18.2 |
| 4,500,165 | 2/1985 | Scholl et al. | 350/96.20 |
| 4,553,811 | 11/1985 | Becker et al. | 350/96.20 |
| 4,611,886 | 9/1986 | Cline et al. | 350/96.20 |
| 4,695,858 | 9/1987 | Takezawa et al. | 357/19 |
| 4,760,568 | 7/1988 | Hine | 350/96.11 X |
| 4,760,569 | 7/1988 | Mahlein | 350/96.11 X |
| 4,767,174 | 8/1988 | Carenco et al. | 350/96.17 X |

FOREIGN PATENT DOCUMENTS 60-17406  1/1985  Japan .
61-242069 10/1986  Japan .

OTHER PUBLICATIONS

Petersen, K. E., "Silicon as a Mechanical Material", Proc. of the IEEE, vol. 70, No. 5, May 1982, pp. 420-457.

Yamada, Y. et al., "Single-Mode Optical Fiber Connection to High-Silica Waveguide with Fiber Guiding Groove", J. of Lightwave Tech., vol. LT-5, No. 12, Dec. 1987, pp. 1716-1720.

Holder, J. D., "Optic-Coupled Integrated Circuits", FPN, Feb. 1988, pp. 26-27.

Hutcheson, L. D. et al., "Optical Interconnects Replace Hardwire", IEEE Spectrum, Mar. 1987, pp. 30-35.

Miyashita, T. et al., "Silica-Based Planar Waveguides for Passive Components", OFC '88, Optical Fiber Comm. Conf., New Orleans, La., Jan. 25-28, 1988, THJ3, p. 173.

Yanagawa, H. et al., "Low-Loss Single-Mode Wavelength Multiplexer", OFC '88, Optical Fiber Comm. Conf., New Orleans, La., Jan. 25-28, 1988, THJ1, p. 171.

Primary Examiner—John D. Lee
Assistant Examiner—Phan T. Heartney
Attorney, Agent, or Firm—Wendy W. Koba

[57] ABSTRACT

Optoelectronic chips, such as Group III-V compound lasers and photodiodes, are mounted on a single-crystal silicon base, and are optically interconnected to one another by silica waveguides and couplers integrally formed on the base. Integrated circuit chips to provide electronic function are also mounted on the base. Various schemes for optically coupling and aligning lasers, photodiodes and optical fibers to the waveguides are described. Also described is the use of a single-crystal silicon lid, which serves to provide optical and electrical isolation between chips on the base, as well as a plug-in arrangement in which the edges of the base are adapted to receive parallel guide rods.

21 Claims, 7 Drawing Sheets

SUBASSEMBLIES FOR OPTOELECTRONIC HYBRID INTEGRATED CIRCUITS

BACKGROUND OF THE INVENTION

This invention relates to optoelectronic integrated circuits (OEICs) and, more particularly, to subassemblies for hybrid versions of OEICs in which individual chips are mounted on a base and are optically and/or electronically interconnected with one another. The chips themselves may be discrete devices such as laser diodes or photodiodes, or integrated devices such as combinations of p-i-n photodiodes and field effect transistors (pinFETs), or integrated circuits such as transmitter circuits or receiver circuits.

In electronic technologies, printed circuit (PC) boards are essentially ubiquitous, being found everywhere from TV sets to computers, from homes to satellites. PC boards enable individual electronic chips and components to be interconnected via metalization patterns deposited on an insulating substrate, such as fiberglass or ceramic board. This technology is very mature, resulting in boards which are relatively easily manufactured with high reliability and reasonably low cost. In contrast, optical and optoelectronic technologies are in their infancy. Discrete devices populate the marketplace, but these components are typically fabricated from high-tech Group III-V compound processes and are packaged in metal or ceramic housings using specialized techniques and equipment that typically render them very expensive. Yields for discrete devices tend to be relatively low and, while integration of optoelectronic components is under investigation, for the near future, it portends even low yields. Consequently, there is a need for another approach, comparable to PC board approach for electronic devices, to enable individual optical and electronic chips to be optically and electronically interconnected and packaged in an easily manufacturable and relatively low-cost fashion.

SUMMARY OF THE INVENTION

In accordance with one aspect of the invention, optoelectronic chips are mounted on a single-crystal semiconductor base and are optically interconnected to one another by waveguides and couplers integrally formed on the semiconductor material. The integrated circuit formed on the base may function, for example, as a transceiver.

In one embodiment, a single-crystal semiconductor lid is mounted on the base to form an enclosure including cavities which optically and/or electrically isolate the components from one another.

In another embodiment, at least one of the waveguides on the base extends under the lid to the exterior of the enclosure, thereby enabling a fiber to be coupled to the waveguide without having it penetrate the enclosure.

In a related embodiment, an alignment fixture is mounted on one end of the base for aligning a fiber to the waveguide.

In still another embodiment, a semiconductor laser has a mesa which engages a groove for aligning the laser to one of the waveguides.

Preferably, the base, lid and fixture are made of silicon in order to exploit the relatively mature technology which has developed in the integrated circuit field. In this case, the waveguides are made of silica and can be designed to cover the most common range for single-mode light propagation of 0.7–1.6 μm. In this form, the invention is said to utilize "silicon optical bench" technology.

BRIEF DESCRIPTION OF THE DRAWING

The invention, together with its various features and advantages, can be readily understood from the following more detailed description taken in conjunction with the accompanying drawing, in which the figures are schematic and have not been drawn to scale in the interest of clarity.

DETAILED DESCRIPTION

Figure 1:
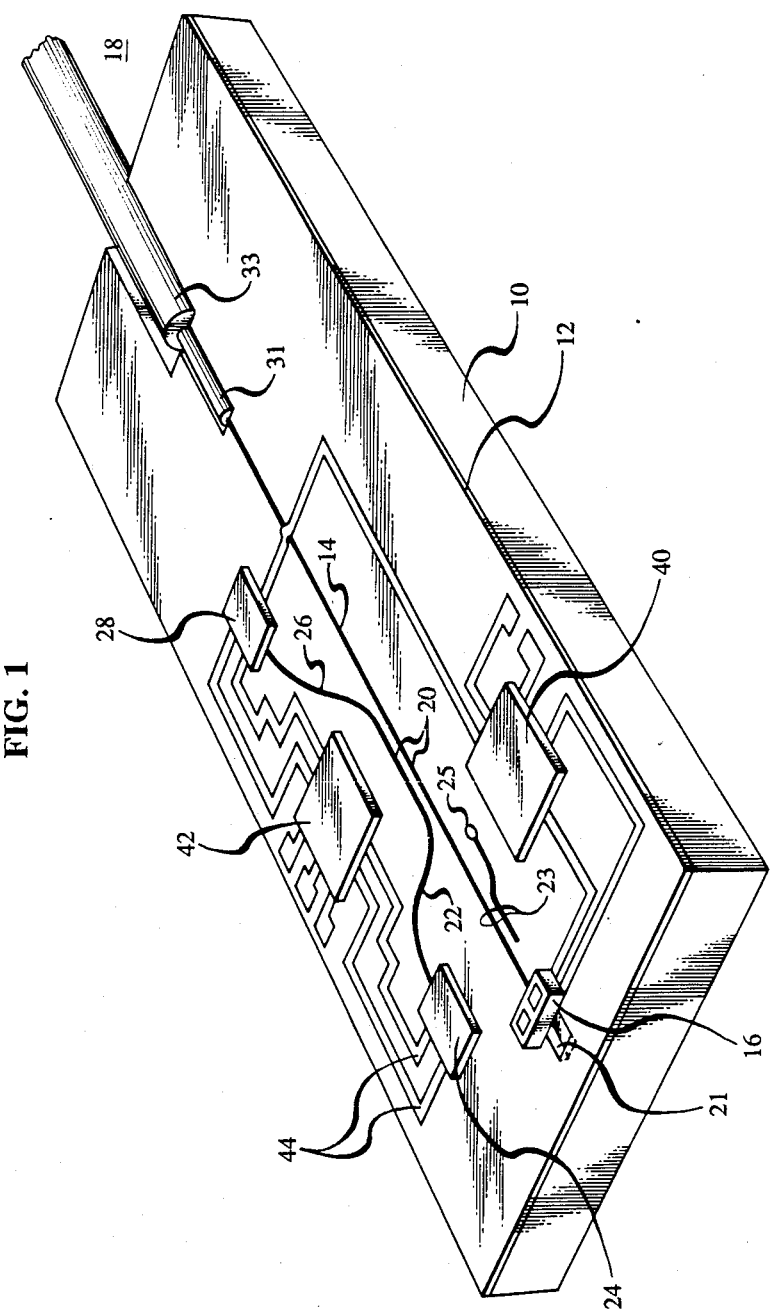
FIG. 1 is an isomeric view of an optoelectronic transceiver subassembly (with the lid removed) in accordance with one embodiment of the invention.

Turning now to FIG. 1, there is an optoelectronic transceiver formed on a single-crystal semiconductor substrate, preferably silicon in order to exploit the mature processing technology and standardized commercial equipment available in this field. A transceiver has been depicted for the purposes of illustration only, because it tends to represent most of the optoelectronic chips which would be found in other circuits such as transmitter and receivers. In general, the silicon base 10 has at least its major surface 12 oxidized (e.g., to form $SiO_2$ layer 12). In addition, the transceiver includes a plurality of single-mode or multi-mode silica waveguides integrally formed on the silicon base in order to optically interconnect the various optoelectronic chips. Illustratively, these waveguides include a transmission waveguide 14 and optical couplers 20 and 23. Waveguide 14 couples a laser diode 16 to an optical fiber 18, and coupler 20, depicted as an evanescent field coupler for single-mode applications, has a waveguide segment 22 for coupling the optical fiber 18 to a receiver photodiode 24 and a waveguide segment 26 for optically coupling laser 16 to a power monitor photodiode 28.

The other coupler 23, which is also shown as an evanescent field coupler, taps a small portion of the power from the waveguide 14 in order to provide an optical test point at location 25, a function which will be described later. For multi-mode applications the couplers 20 and 23 would preferably take the form of well-known Y-couplers rather than evanescent field couplers.

The oxide layer 12 on the base serves to electrically isolate the various electrical contacts formed thereon and to optically isolate the evanescent part of the optical mode in the waveguide from the base.

Figure 6:
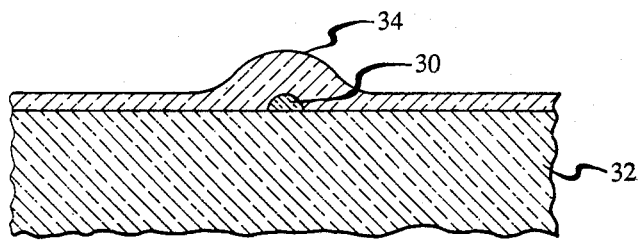
FIG. 6 is a cross-sectional view of a silica waveguide formed on the silicon base of FIG. 1.
Figure 7:
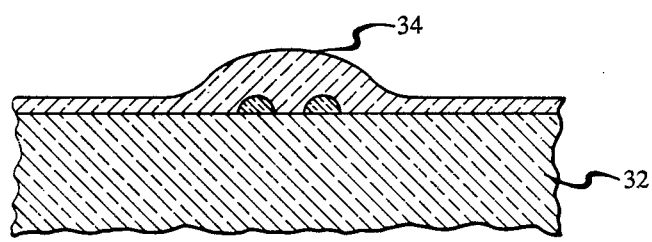
FIG. 7 shows the arrangement of the cores of the silica waveguides in the region where couplers are formed on the silicon base of FIG. 1.

As shown in FIG. 6, the silica waveguides typically have an approximately semi-circular core 30 surrounded by a lower cladding 32 and an upper cladding 34. The semi-circular shape of the core matches the mode in the waveguide 14 (FIG. 1) to that in the fiber 18, and is about 5 μm in diameter for single-mode propagation. Preferably, the lower cladding 32 is formed by oxidizing the surface of the silicon base 10, and the core is formed by depositing phosphosilicate glass by chemical vapor deposition, patterning the glass to define the core and then flowing of the patterned core to form the semi-circular shape. The upper cladding 34 is then formed by depositing silica and, subsequently, densification of the silica glass. This process is described in concurrently filed application Ser. No. 163,687, filed Mar. 3, 1988 entitled "Device Including a Substrate-Supported Optical Waveguide, and Method of Manufacture", which is incorporated herein by reference. Waveguides of this type have optical losses of less than 0.03 dB/cm in the wavelength range of principal interest for optical communications; that is, 0.7-1.6 μm. Couplers involve side-by-side positioning of two cores, as shown in FIG. 7, so that the evanescent field of one waveguide overlaps the adjacent one sufficiently to transfer optical power from one to the other. Such couplers are described in concurrently filed application Ser. No. 163,686, filed Mar. 3, 1988 entitled "Thin-film Optical Communications Coupler", which is also incorporated herein by reference.

In addition to the optical chips described above, the transceiver is shown schematically to include electronic circuit chips, such as the laser driver circuit 40 connected to the laser diode 16 and the receiver circuit 42 electrically connected to both the receiver photodiode 24 and the monitor photodiode 28. Positioning the photodiodes as shown facilites echo cancellation, if required; however, the circuit 40 and photodiode 28 can be positioned on the same side of waveguide 14 to avoid the cross-over electrical connection 7. Nevertheless, provided the cladding of the waveguide is thick enough to avoid significant absorption by the metal in the connection, the cross-over can be utilized.

The discussion which follows will focus primarily on the optical chips and, in particular, on the manner in which they are optically coupled to the silica waveguides.

Figure 2:
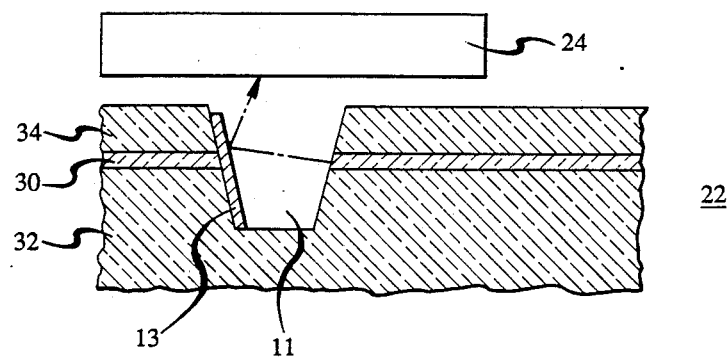
FIGS. 2–5 are cross-sectional views of portions of the base showing how light in the integral silica waveguide can be deflected upwardly so as to provide an optical test point or to couple light to an on-board photodetector.
Figure 3:
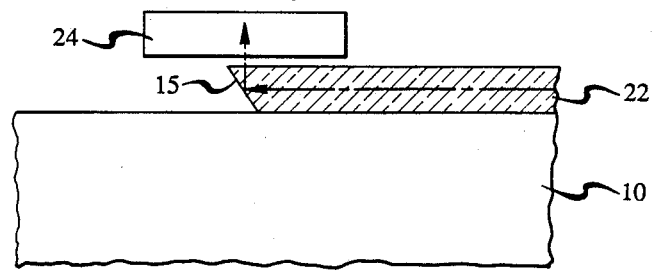
Figure 4:
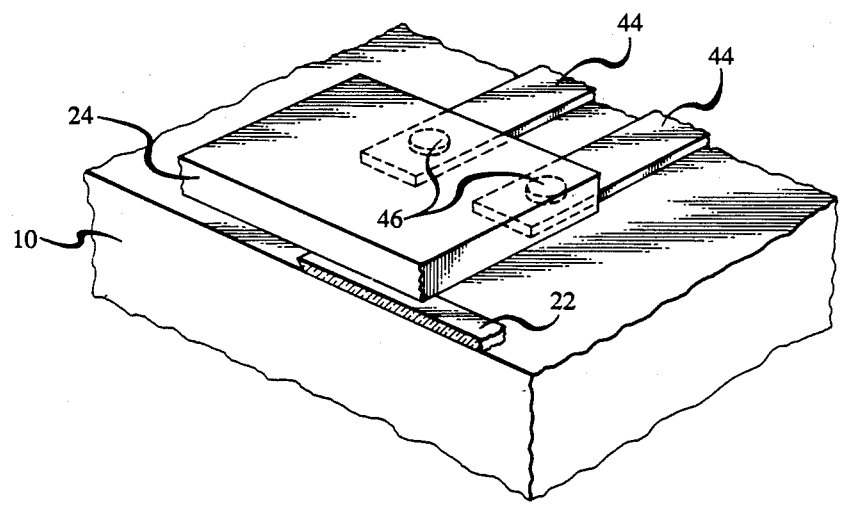

The coupling of the silica waveguide to a photodetector is shown in FIGS. 2-5. In one embodiment, as shown in FIGS. 2 and 4, the photodiode 24 is oriented flat on the base 10 and is elevated above the waveguide 22 by the underlying electrodes 44, along with solder bumps 46 disposed between the electrodes 44 and the photodiode 24 (FIG. 4). In order to redirect the light in the waveguide 22, a groove 11 is etched through the core 30 (FIG. 2) so that the axis of the groove is transverse to the axis of the waveguide, and one sidewall remote from the end of the waveguide is metalized to form a reflector 13. Thus, light emanating from the end of the waveguide, which strikes the reflector 13, is redirected upwardly to the photodiode 24.

Alternatively, as shown in FIG. 3, the end of the waveguide 22 can be shaped to form an oblique surface 15 which undercuts the end of the waveguide and serves, by total internal reflection, to redirect the light upwardly to the photodiode 24.

Importantly, these techniques for redirecting the light traveling in the waveguides to a direction upwardly from the base 10 give rise to a significant feature of the invention; that is, the provision of a test point 25, as shown in FIG. 1. Test point 25, which corresponds to the locations of FIGS. 2 and 3 where light is redirected upwardly by the oblique reflecting surfaces, can be utilized to monitor assembly functions or circuit operations. Such applications are described in concurrently filed application Ser. No. 163,903, filed Mar. 3, 1988 entitled "Testing in the Manufacture, Operation and Maintenance of Optical Device Assemblies", which is incorporated herein by reference. For example, in order to determine whether or not the laser 16 is accurately aligned to the waveguide 14, coupler 23 couples a small fraction of the light from the waveguide 14 to the test point 25. It is contemplated that a test head, containing a photodetector in the appropriate position, could be positioned over the base 10 during assembly. With the laser operating, laser-to-waveguide alignment achieved when the optical power at test point 25 is maximized. In like fashion, other test points could be incorporated on the base 10 to enable various forms of testing and measuring to be performed, either automatically during operation of the transceiver, or manually in the field by allowing a craftsman to position an appropriately designed test head over the test point to determine whether a failure has occurred in the circuit.

Figure 5:
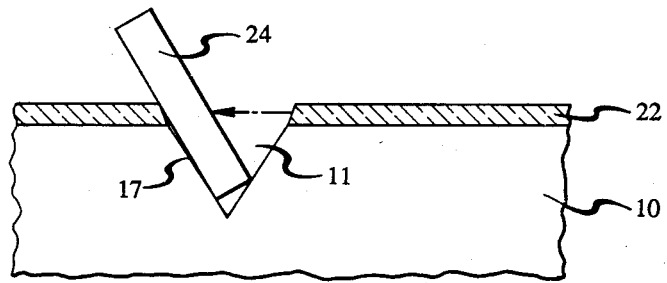

Alternatively, as shown in FIG. 5, the photodiode need not lay flat on the base 10 and, in such cases, a V-groove anisotropically etched in the base 10 can be utilized to position the photodiode 24 along the sidewall remote from the end of the waveguide 22. In this fashion, the light emanating from the end of the waveguide strikes the photodiode directly. This configuration has the advantage that the oblique orientation of the photodiode reduces the likelihood that spurious reflections will be coupled back into the waveguide 22 and possible disrupt other components, such as lasers, coupled to that waveguide.

Figure 8:
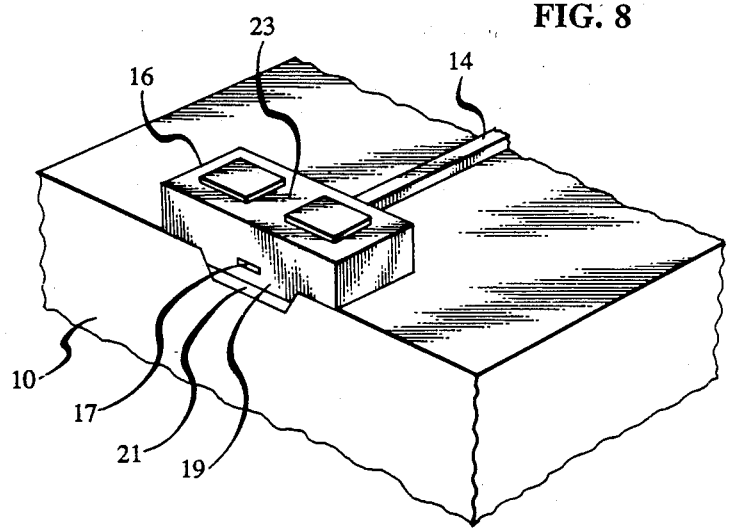
FIG. 8 shows an enlarged view of how the semiconductor laser of FIG. 1 is aligned to the silica waveguide.
Figure 9:
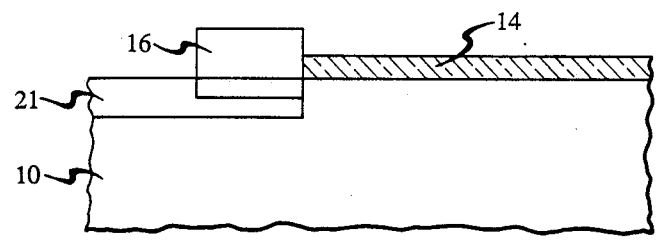
FIG. 9 is a cross-sectional side view of FIG. 4.

The coupling of the laser diode 16 to the waveguide 14 is depicted in FIGS. 8 and 9. The alignment scheme described here can be utilized independently of the optical test point 25 or, if desired, in conjunction therewith. As shown in FIG. 8, the laser diode 16 has a mesa 19 formed on one surface thereof, and the base 10 has a groove 21 axially aligned with the waveguide 14. The mesa may be formed on the laser specifically for purposes of alignment or may be an integral part of the laser for other purposes (e.g., the waveguiding ridge of a ridge-waveguide laser). In any case, the mesa 19 is guided by the groove 21 to provide alignment of the active region 17 of the laser diode to the waveguide 14. The mesa and groove may be designed to produce precise alignment to the waveguide directly, or may produce only coarse alignment if so desired. In the latter case, the laser diode 16 may be optically pumped by a separate laser (e.g., a Nd:YAF laser (not shown) if laser diode 16 is a 1.3 μm InP/InGaAsP device), and the light coupled into the waveguide 14 is maximized by monitoring either the light coupled into the fiber 18 or into the test point 25. Optical pumping of the laser diode 16 is achieved by providing an aperture 23 in the metalization on the top side of the laser so that the pumping radiation can penetrate to its active region. Of course, if the top side metalization is not needed for other purposes (e.g., testing prior to mounting on the base), then it can be omitted altogether, thus obviating the need to form an aperture 23. Optical pumping of the laser to achieve alignment is described in concurrently filed application Ser. No. 163,689, filed Mar. 3, 1988 entitled "Article Comprising an Opto-Electronic Device and an Optical Waveguide Coupled Thereto, and Method of Making the Article", which is incorporated herein by reference.

Figure 10:
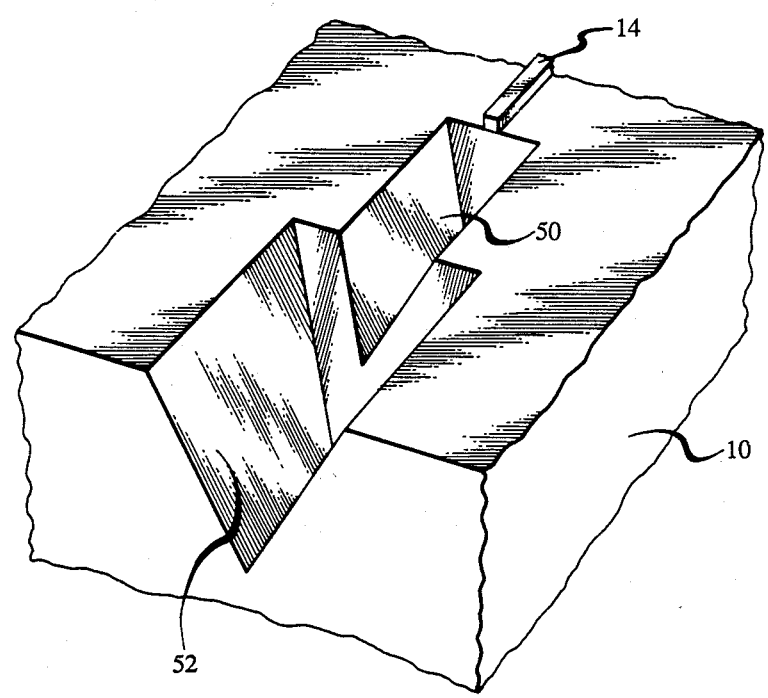
FIG. 10 shows a tandem V-groove arrangement utilized to align and couple an optical fiber to the silica waveguide of FIG. 1.

The fiber 18 is optically coupled to the waveguide 14 by means of a pair tandem V-grooves as shown in FIG. 10. A relatively narrow V-groove 50 is aligned with the optical axis of the waveguide 14, and its size is adapted to receive the bare portion 31 of fiber 18 (FIG. 1), whereas the larger V-groove 52 is axially aligned with the groove 50 and its size is adapted to receive the coated portion 33 of fiber 18 (FIG. 1). The v-grooves are anisotropically etched by first partially etching the larger groove 52 while the location for the narrower groove is masked, then removing the mask and completing the etching of the larger groove and the narrower groove simultaneously. The technique for forming the V-grooves is described in concurrently filed application Ser. No. 163,685, filed Mar. 3, 1988 entitled "Method of Making an Article Comprising a Tandem Groove and Article Produced by the Method", which is also incorporated herein by reference.

The optical subassemblies described above may be completed, as shown in FIGS. 11 and 12, by providing a lid 70 which encloses the various chips mounted on the base 10; for simplicity, only a laser diode 92 and a photodiode 94 coupled by a waveguide 80 are shown. For hermetic applications, the lid is sealed around its periphery to the base. To simplify achieving hermeticity, the fiber 18 does not penetrate the hermetic enclosure. Instead, a silicon fixture 76 has a V-groove 78 which is aligned above the V-groove 50 in the base 10 so as to form a channel to receive the fiber. The channel serves to guide the fiber and couple it to waveguide 80 which extends into the hermetic enclosure. Although a notch could be formed in the lid to accommodate the waveguide 80, in practice the sealant used to form the hermetic seal is sufficiently maleable to accommodate the waveguide without the need for a notch. In general, the fixture 76 and lid 70 could be a unitary piecepart, but preferably they are separate, as shown.

Figure 12:
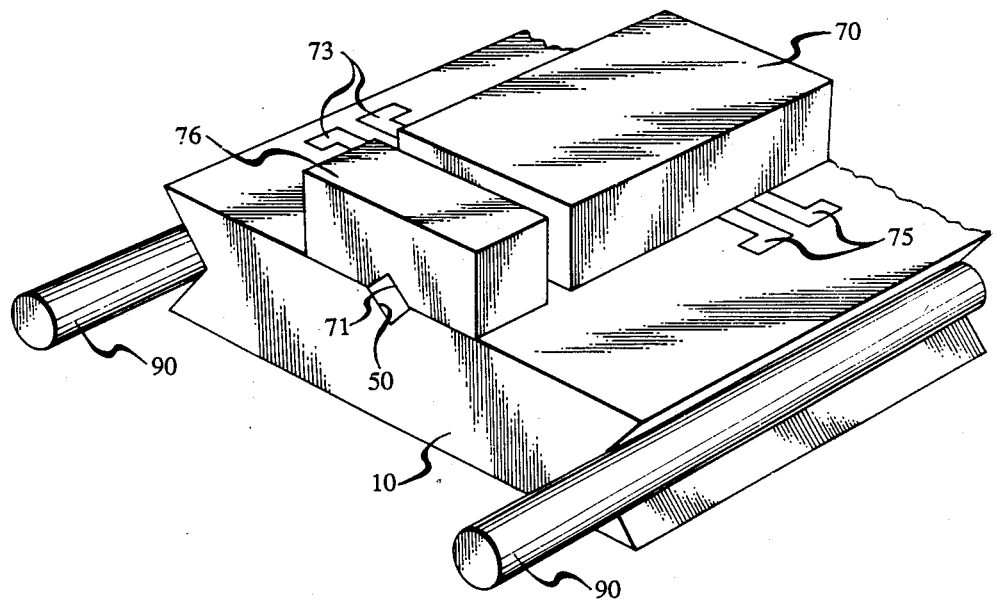
FIGS. 12–13 show how the subassembly can be adapted to guide rods so that, in the fashion of PC boards, it can be plugged into a frame of equipment.

As shown in FIG. 12, the lid 70 has a dimension parallel to the base 10 which is shorter than the corresponding dimension of the base so that leads formed thereon protrude from under the lid and allow electrical access thereto. Only two sets of such leads 73 and 75 are depicted for the purposes of illustration.

Figure 11:
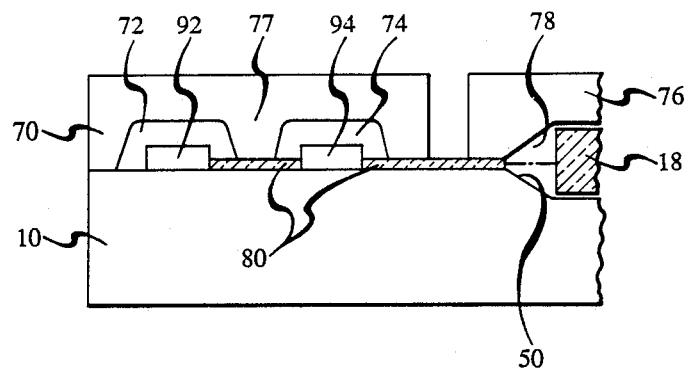
FIG. 11 shows a cross-sectional view of a subassembly of the type depicted in FIG. 1, but for simplicity only two device, a laser diode and a photodiode, are depicted on the silicon base. This figure illustrated several features: a silicon lid which isolates the devices from one another; a waveguide which extends from under the lid to the exterior of the enclosure so that the fiber need not penetrate the enclosure; and an alignment fixture at one end of the base for aligning the fiber to the waveguide.

Moreover, the lid 70 may be utilized to provide an additional significant feature of the invention, that of optical and electrical isolation of chips on the base 10, as shown in FIG. 11. For optical isolation at long wavelengths (e.g., about 1.1–1.6 $\mu$m), the interior surface of the lid is preferably metalized (not shown); in practice, the silicon is preferably oxidized before the metal is deposited. At shorter wavelengths (e.g., about 0.7–0.9 $\mu$m), metalization may not be required, since silicon absorbs light at those wavelengths. In either case, the lid 70 is provided with a pair of separated cavities 72 and 74, which are adapted to receive the laser 92 and photodiode 94, respectively, when the lid is in place. Thus, the devices are separated by segments of the lid (such as 77) which electrically and optically isolate the devices from one another.

It is apparent that the lid serves multiple purposes including: protecting the chips during molding operations associated with encapsulating the subassembly in a package; and electrically and/or optically isolating chips. In addition, it can be used to contain a conformal coating in the cavities for the purpose of passivating the chips, if necessary.

Figure 13:
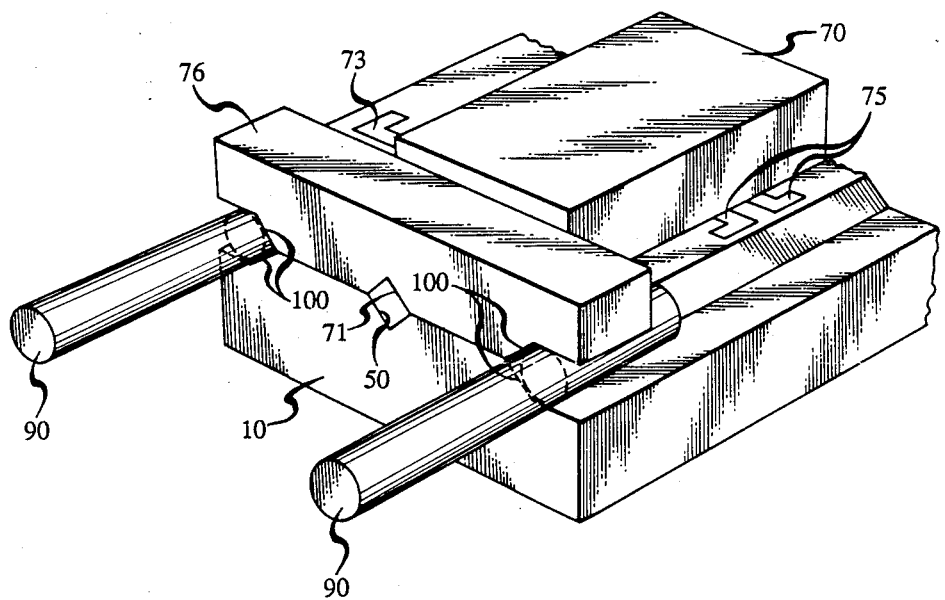

In addition, the base 10 (or the fixture 76, or both) may be provided with V-grooves along the parallel edges thereof, as shown in FIGS. 12–13, to accommodate guide rods 90 which may be utilized for plugging the subassembly into an equipment frame or rack. Of course, the guide rods would thereby enable the subassembly to be automatically coupled to fibers (such as 18) which are part of the frame or rack equipment. The subassembly may be used with a base on which any optoelectronic device is mounted (with or without a lid) and is optically coupled to the fiber, it is not limited to embodiments in which the base carries an integrated circuit.

In FIG. 12, the V-grooves 100 are formed along parallel edges of base 10 so as to accommodate the rods 90. The latter may be affixed to the base, or may be part of an equipment frame. Alternatively, in FIG. 13 fixture 76 is made wider, extending to the width of the base. Parallel edges of the fixture and base are etched so that, when assembled, the etched features form V-grooves 100 for receiving the rods 90. From a processing standpoint the FIG. 13 design may be simpler to fabricate because the FIG. 12 design entails etching from both sides of the base with consequent need for front-to-back alignment of masks.

It is to be understood that the above-described arrangements are merely illustrative of the many possible specific embodiments which can be devices to represent application of the principles of the invention. Numerous and varied other arrangements can be devised in accordance with these principles by those skilled in the art without departing from the spirit and scope of the invention.

What is claimed is:

1. An optoelectronic integrated circuit subassembly comprising
    a single-crystal semiconductor base having a major surface and an insulative layer formed on said surface,
    optical waveguides integrally formed on said surface,
    at least two optoelectronic chips mounted on said base and optically coupled to said waveguides, said chips being physically separated from one another,
    a single-crystal semiconductor lid on said base, said lid including at least two physically separate cavities for receiving said chips, said cavities being separated by material in said lid which electrically and optically isolates said chips from one another.

2. The subassembly of claim 1 wherein said lid is hermetically sealed to said base and at least one of said waveguides extends from under said lid to the exterior thereof and further including means exterior to said lid for coupling said at least one waveguide to an optical fiber.

3. The subassembly of claim 1 wherein said lid has a dimension measured parallel to said surface which is less than the corresponding dimension of said base and further including electrical contacts on said base which extend from said chips under said lid to the exterior thereof.

4. The subassembly of claim 1 wherein parallel edges of said base or said lid include grooves adapted to receive guide rods.

5. The subassembly of claim 1 wherein
said waveguides include a transmission waveguide and a secondary waveguide forming a pair of optical couplers thereto,
said chips include a receiver photodetector optically connected to one of said couplers, a monitor photodetector optically coupled to another of said couplers, and further including a laser diode coupled to one end of said transmission waveguide, and further including
fiber alignment means disposed at the other end of said transmission waveguide.

6. The subassembly of claim 1 wherein
said waveguides include a transmission waveguide,
one of said chips comprises a laser diode optically coupled to one end of said transmission waveguide, and further including
a coupler for extracting a fraction of the light coupled from said laser diode into said transmission waveguide, and
means for redirecting the light in said coupler to a test point where light emanates upwardly from said base, thereby to enable the alignment of the laser to the transmission waveguide to be monitored.

7. An optoelectronic integrated circuit subassembly comprising
a single-crystal semiconductor base having a major surface,
an optical waveguide integrally formed on said surface,
an optoelectronic chip mounted on said surface and optically coupled to said waveguide,
a single-crystal semiconductor lid sealed to said base and forming an enclosure which covers said chip,
said waveguide extending from under said lid to the exterior thereof, and
means exterior to said enclosure for coupling said waveguide to an optical fiber.

8. The subassembly of claim 7 wherein said lid has a dimension measured parallel to said surface which is less than the corresponding dimension of said base and further including electrical contacts on said base which extend from said chips under said lid to the exterior thereof.

9. The subassembly of claim 7 wherein parallel edges of said base or said lid include grooves adapted to receive guide rods.

10. An optoelectronic subassembly comprising
a single-crystal semiconductor base having a major surface in which a groove is formed,
an optical waveguide integrally formed on said surface and axially aligned with said groove, and
a semiconductor laser mounted on said surface having a mesa formed thereon and an active region, said mesa being disposed in said groove so as to align said active region with said waveguide.

11. The subassembly of claim 10 wherein
said laser has opposing major surfaces, said mesa is disposed on one of said major surfaces, and
metalization having an aperture therein is disposed on said opposing major surface.

12. An optoelectronic subassembly comprising
a single-crystal semiconductor base,
an optoelectronic device mounted on said base,
means for optically coupling said device to an optical fiber, and
means for receiving at least two spaced-apart rods for guiding said subassembly into alignment with other equipment exterior said subassembly.

13. The subassembly of claim 12 wherein
said base has a pair of parallel edges, and
said receiving means includes a V-groove formed in each of said edges, one of said rods being positionable in each of said grooves.

14. The subassembly of claim 12 wherein
said base has a pair of parallel edges, and
said coupling means includes a single-crystal semiconductor fixture mounted at one end of said base, said fixture having a pair of edges parallel to those of said base, said edges having oblique surfaces therein forming parallel V-grooves, and
one of said rods being positionable in each of said grooves.

15. The subassembly of claim 14 wherein
said fixture and said base have major surfaces in which V-grooves are disposed in axial alignment with one another so as to form a channel to receive said fiber.

16. The subassembly of claims 13 or 14 including means for affixing said rods in said V-grooves.

17. An optoelectronic integrated circuit subassembly comprising
a single-crystal silicon base having a major surface and an insulative layer formed on said surface,
optical waveguides integrally formed on said surface,
at least two optoelectronic chips mounted on said base and optically coupled to said waveguides, said chips being physically separated from one another,
a single-crystal silicon lid on said base, said lid including at least two physically separate cavities for receiving said chips, said cavities being separated by material in said lid which electrically and optically isolates said chips from one another,
at least one of said waveguides extending from under said lid to the exterior thereof,
means exterior to said lid for coupling said at least one waveguide to an optical fiber,
said lid having a dimension measured parallel to said surface which is less than the corresponding dimension of said base and further including electrical contacts on said base which extend from said chips under said lid to the exterior thereof.

18. The subassembly of claim 17 wherein
said waveguides include a transmission waveguide and a secondary waveguide forming a pair of optical couplers thereto, and
said chips include a receiver photodetector optically connected to one of said couplers, a monitor photodetector optically coupled to another of said couplers, and further including a laser diode coupled to one end of said transmission waveguide.

19. The subassembly of claim 18 wherein
said base has a major surface in which a groove is formed, one of said waveguides is axially aligned with said groove, and said laser has a mesa formed thereon and an active region, said mesa being disposed in said groove so as to align said active region with said one waveguide.

20. The subassembly of claim 17 wherein said base has a pair of parallel edges perpendicular to said major surface and a V-groove formed in each of said edges, so that guide rods for said subassembly are positionable in said grooves.

21. The subassembly of claim 17 wherein said base has a pair of parallel edges, and said coupling means includes a single-crystal silicon fixture mounted at one end of said base, said fixture having a pair of edges parallel to those of said base, said edges having oblique surfaces therein forming parallel V-grooves, so that guide rods for said subassembly are positionable in said grooves.

* * * * *